United States Patent
Kawasaki (10) Patent No.: US 11,187,978 B2
(45) Date of Patent: Nov. 30, 2021

(54) PLANARIZATION APPARATUS

(71) Applicant: CANON KABUSHIKI KAISHA, Tokyo (JP)

(72) Inventor: Youji Kawasaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 66 days.

(21) Appl. No.: 16/269,944

(22) Filed: Feb. 7, 2019

(65) Prior Publication Data

US 2019/0258158 A1 Aug. 22, 2019

(30) Foreign Application Priority Data

Feb. 19, 2018 (JP) .............................. JP2018-027252

(51) Int. Cl.
*G03F 7/00* (2006.01)

(52) U.S. Cl.
CPC ................................. *G03F 7/0002* (2013.01)

(58) Field of Classification Search
CPC .................................................... G03F 7/0002
See application file for complete search history.

(56) References Cited

U.S. PATENT DOCUMENTS

| | | | | |
|---|---|---|---|---|
| 6,943,117 B2* | 9/2005 | Jeong | .................... | B82Y 10/00 |
| | | | | 257/E21.026 |
| 9,568,819 B2* | 2/2017 | Torii | .................... | B82Y 10/00 |
| 9,941,137 B2* | 4/2018 | Takahata | .................... | H01L 21/3086 |
| 10,421,219 B2* | 9/2019 | Hattori | .................... | B29C 43/58 |
| 2007/0228610 A1* | 10/2007 | Sreenivasan | .................... | G03F 9/7084 |
| | | | | 264/319 |
| 2010/0031833 A1* | 2/2010 | Kasumi | .................... | B82Y 10/00 |
| | | | | 101/4 |
| 2010/0044921 A1* | 2/2010 | Ito | .................... | B82Y 10/00 |
| | | | | 264/402 |
| 2010/0314798 A1* | 12/2010 | Kawakami | .................... | B82Y 10/00 |
| | | | | 264/293 |
| 2014/0239529 A1* | 8/2014 | Tan | .................... | G03F 9/703 |
| | | | | 264/40.5 |
| 2014/0272174 A1* | 9/2014 | Furutono | .................... | H01L 31/02366 |
| | | | | 427/487 |

(Continued)

FOREIGN PATENT DOCUMENTS

JP 2016219679 A 12/2016

*Primary Examiner* — Nahida Sultana (74) *Attorney, Agent, or Firm* — Rossi, Kimms & McDowell LLP (57) ABSTRACT

The present invention provides a planarization apparatus which planarizes a composition on a substrate by using a mold, the apparatus including a processing unit configured to, for each of a plurality of substrates, perform planarization processing for, by bringing a planar portion of the mold into contact with the composition on the substrate and making the planar portion conform to a surface shape of the substrate, planarizing the composition, and a driving unit configured to, whenever the planarization processing is performed a predetermined number of times, relatively drive the mold and a processing target substrate among the plurality of substrate so that a relative positional relationship between the processing target substrate and the planar portion changes.

14 Claims, 5 Drawing Sheets

(56) References Cited

U.S. PATENT DOCUMENTS

| | | | | |
|---|---|---|---|---|
| 2014/0346700 A1* | 11/2014 | Sato | ................ | G03F 7/0002 |
| | | | | 264/40.1 |
| 2016/0096313 A1* | 4/2016 | Usui | ................ | G03F 7/0002 |
| | | | | 264/40.1 |
| 2016/0363875 A1* | 12/2016 | Shinoda | ................ | G03F 7/0002 |
| 2017/0285331 A1* | 10/2017 | Miyaharu | ................ | G03F 7/0002 |
| 2018/0067392 A1* | 3/2018 | Murasato | ................ | G03F 7/2051 |
| 2019/0302613 A1* | 10/2019 | Aichi | ................ | G03F 7/70716 |
| 2019/0333757 A1* | 10/2019 | Nishimura | ................ | G03F 7/0002 |
| 2020/0159128 A1* | 5/2020 | Calado | ................ | B24B 37/005 |
| 2020/0411308 A1* | 12/2020 | Lundy | ................ | H01L 21/02318 |

* cited by examiner

PLANARIZATION APPARATUS

BACKGROUND OF THE INVENTION

Field of the Invention

The present invention relates to a planarization apparatus.

Description of the Related Art

There is continued demand for miniaturization of semiconductor devices, and in addition to conventional photolithography, a micropatterning process technique of molding and curing an uncured imprint material on a substrate by a mold to thereby form a pattern of the imprint material on the substrate is attracting attention. Such a technique is referred to as an imprinting technique, and it is possible to form fine patterns on the order of nanometers on the substrate thereby.

One example of an imprinting technique is a photocuring method. An imprint apparatus that uses a photocuring method molds a photocurable imprint material supplied onto the substrate (shot region) by a mold, and cures the imprint material by irradiating it with light, and by then separating the mold from the cured imprint material, forms a pattern on the substrate.

Also, in recent years, a technique of planarizing a substrate by using an imprint apparatus has been proposed in Japanese Patent Laid-Open No. 2016-219679. With regards to techniques for planarizing substrates, there is a commonly known technique in which an unevenness on a substrate is planarized by forming a coating film on the substrate using a conventional coating apparatus (spin coater), but it is insufficient to planarize an unevenness in a substrate at a nanoscopic scale. Meanwhile, because a technique disclosed in Japanese Patent Laid-Open No. 2016-219679 drops imprint material based on an unevenness in a substrate for each shot region of the substrate, it can improve accuracy of planarization compared to conventional planarizing techniques.

However, in techniques for planarizing a substrate using an imprint apparatus, countermeasures against adherence (hereinafter referred to as "defect") of an imprint material to a mold are not sufficient. For example, due to non-uniformity or distortion of an underlayer pattern formed on the substrate or the distribution of imprint material supplied on the substrate (distribution of a drop amount) or the like, there are specific locations that are potentially prone to defects in a mold. Because defects are generated at such locations when substrates continue to be planarized, it can be the cause of a reduction in the accuracy of planarization of a substrate.

SUMMARY OF THE INVENTION

The present invention provides a planarization apparatus that is advantageous at planarizing substrates.

According to one aspect of the present invention, there is provided a planarization apparatus which planarizes a composition on a substrate by using a mold, the apparatus comprising a processing unit configured to, for each of a plurality of substrates, perform planarization processing for, by bringing a planar portion of the mold into contact with the composition on the substrate and making the planar portion conform to a surface shape of the substrate, planarizing the composition, and a driving unit configured to, whenever the planarization processing is performed a predetermined number of times, relatively drive the mold and a processing target substrate among the plurality of substrate so that a relative positional relationship between the processing target substrate and the planar portion changes.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
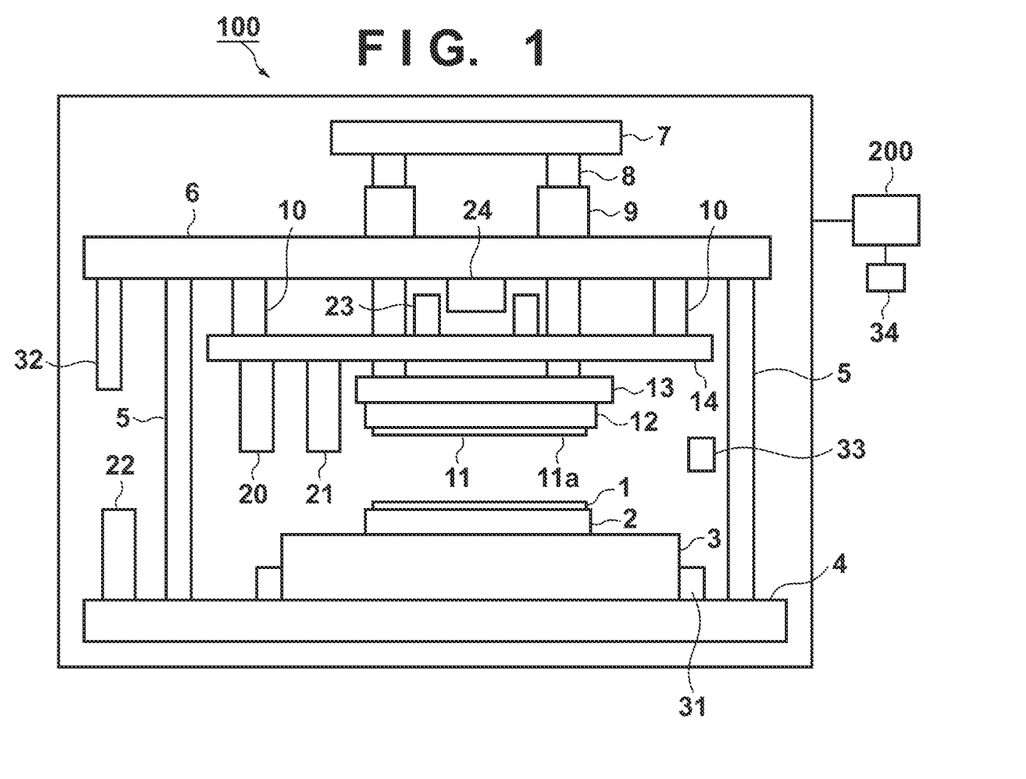
FIG. 1 is a schematic view showing a configuration of a planarization apparatus as an aspect of the present invention.

FIG. 1 is a schematic view showing a configuration of a planarization apparatus 100 as one aspect of the present invention. The planarization apparatus 100 is realized by a molding apparatus (a so-called imprint apparatus) for molding an imprint material (composition) on a substrate by using a mold (template), and in the present embodiment, the planarization apparatus 100 planarizes the imprint material on the substrate. The planarization apparatus 100 cures the imprint material in a state in which the imprint material on the substrate and the mold have been brought into contact, and by separating the cured imprint material and the mold, forms a flat surface in the imprint material on the substrate.

The planarization apparatus 100, as illustrated in FIG. 1, includes a chuck 2, a substrate stage 3, a base surface plate 4, columns 5, a top plate 6, a guide bar plate 7, guide bars 8, a mold driving unit 9, columns 10, a mold chuck 12, a head 13, and an alignment scope shelf 14. Also, the planarization apparatus 100 includes a supply unit 20, an off-axis alignment (OA) scope 21, a substrate conveyance unit 22, an alignment scope 23, a light source 24, a stage driving unit 31, a mold conveyance unit 32, a cleaning unit 33, an input unit 34, and a control unit 200. In the present embodiment, the chuck 2 and the substrate stage 3 configure a substrate holder for holding a substrate 1, and the mold chuck 12 and the head 13 configure a mold holder for holding a mold 11. Here, an XYZ coordinate system is defined such that the horizontal plane is the XY plane, and the vertical direction is a Z-axis direction.

Referring to FIG. 1, the substrate 1 is loaded from outside of the planarization apparatus 100 by the substrate conveyance unit 22, which includes a conveyance hand or the like, and the substrate 1 is held by the chuck 2. The substrate stage 3 is supported by the base surface plate 4, and is driven in the X-axis direction and the Y-axis direction in order to align the substrate 1 held by the chuck 2 with a predetermined position. The stage driving unit 31 includes a linear motor, an air cylinder, or the like, for example, and drives (moves) the substrate stage 3 in at least the X-axis direction and the Y-axis direction, but may have a function for driving the substrate stage 3 in directions other than two axes (for example, six axial directions). Also, the stage driving unit 31 includes a rotation mechanism, and performs rotational driving (rotating) of the chuck 2 or the substrate stage 3 about an axis parallel to the Z-axis direction.

The mold 11 is loaded from outside of the planarization apparatus 100 by the mold conveyance unit 32 which includes a conveyance hand or the like, and the mold 11 is held by the mold chuck 12. The mold 11 has a circular or rectangular outer shape, for example, and includes a planar portion 11a that contacts the imprint material on the substrate and conforms to the surface shape of the substrate 1. The planar portion 11a is the same size as the substrate 1 or is larger than the substrate 1 in the present embodiment. The mold chuck 12 is supported by the head 13, and has a function for correcting an inclination of the mold 11 about the Z axis. Each of the mold chuck 12 and the head 13 includes an opening (not shown) that allows light (ultraviolet light) irradiated via a collimating lens from the light source 24 to pass through. Also, a load cell for measuring a pressing force of the mold 11 in relation to the imprint material on the substrate is provided on the mold chuck 12 or the head 13.

On the base surface plate 4, the columns 5 which support the top plate 6 are provided. The guide bars 8 penetrate the top plate 6, one end is fixed to the guide bar plate 7, and the other end is fixed to the head 13. The mold driving unit 9, via the guide bars 8, drives the head 13 in the Z-axis direction, to cause the mold 11 held by the mold chuck 12 to contact the imprint material on the substrate, and to separate from the imprint material on the substrate. Also, the mold driving unit 9, in the present embodiment, has a function for driving (moving) the head 13 in the X-axis direction and the Y-axis direction, and a function for rotationally driving the mold chuck 12 or the head 13 about an axis parallel to the Z-axis direction.

The alignment scope shelf 14 is suspended from the top plate 6 via the columns 10. The guide bars 8 penetrate into the alignment scope shelf 14. Also, a height measurement system (not shown) that uses a grazing incidence image shift method, for example, to measure the height (flatness) of the substrate 1 held by the chuck 2 is arranged in the alignment scope shelf 14.

The alignment scope 23 includes an optical system and an imaging capturing system for observing a reference mark provided on the substrate stage 3 and an alignment mark provided on the mold 11. However, in the case where the alignment mark is not provided on the mold 11, configuration may be such that the alignment scope 23 is not present. The alignment scope 23 is used for measuring the relative position between the reference mark provided on the substrate stage 3 and the alignment mark provided on the mold 11, and for alignment to correct the misalignment.

The supply unit 20 is configured with a dispenser including a discharge outlet (nozzle) for discharging uncured imprint material (liquid form) on the substrate 1, and supplies (coats) the imprint material onto the substrate. The supply unit 20 uses, for example, a piezo-jet method or a microsolenoid method or the like, and can supply an imprint material of a minute volume on the order of 1 pL (picoliter) onto the substrate. Also, the number of discharge outlets in the supply unit 20 is not limited, and may be one (single nozzle) and may exceed 100 (that is, there may be a linear nozzle array, and there may be a combination of multiple linear nozzle arrays).

The OA scope 21 is supported by the alignment scope shelf 14. The OA scope 21 detects alignment marks provided on a plurality of shot regions of the substrate 1, and is used for global alignment processing for deciding the respective positions of the plurality of shot regions. By obtaining a positional relationship between the mold 11 and the substrate stage 3 by the alignment scope 23, and by obtaining a positional relationship between the substrate 1 and the substrate stage 3 by the OA scope 21, it is possible to perform a relative alignment between the mold 11 and the substrate 1.

The cleaning unit 33 cleans (cleaning) the mold 11 in a state in which the mold 11 is held by the mold chuck 12. In the present embodiment, the cleaning unit 33 removes imprint material that is adhered to the mold 11 and in particular the planar portion 11a by separating the mold 11 from the imprint material after it is cured on the substrate. The cleaning unit 33 may, for example, wipe off imprint material adhered to the mold 11, and may remove imprint material that is adhered to the mold 11 by using UV radiation, wet cleaning, plasma cleaning, or the like.

The control unit 200 includes a CPU, a memory, and the like, and controls the entirety of the planarization apparatus 100. The control unit 200 controls each unit of the planarization apparatus 100 comprehensively, and functions as a processing unit for performing planarization processing. Here, the planarization processing is processing for planarizing the imprint material by bringing the planar portion 11a of the mold 11 into contact with the imprint material on the substrate, and making the planar portion 11a conform to the surface shape of the substrate 1. Note that the planarization processing typically is performed in units of lots, in other words performed for each of a plurality of substrates included in the same lot.

Figure 2A:
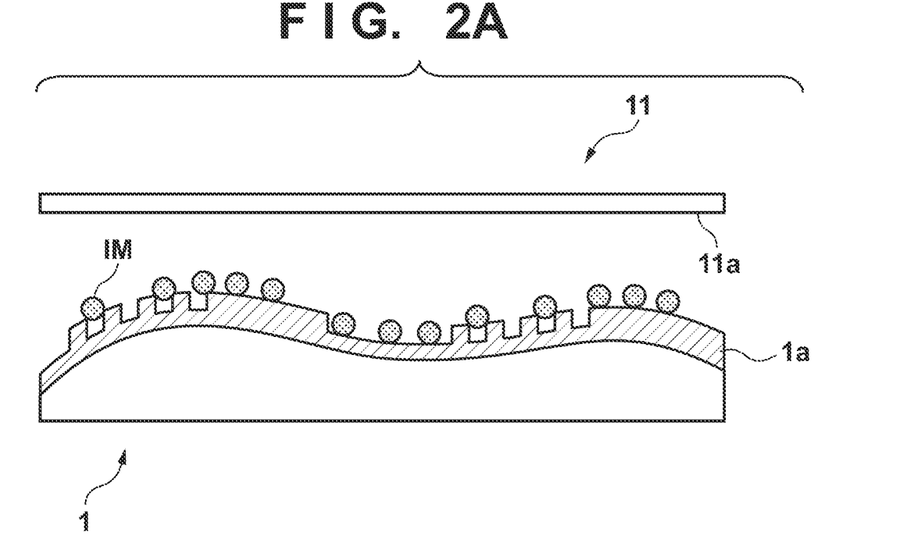
FIGS. 2A to 2C are views for explaining an overview of planarization processing.
Figure 2B:
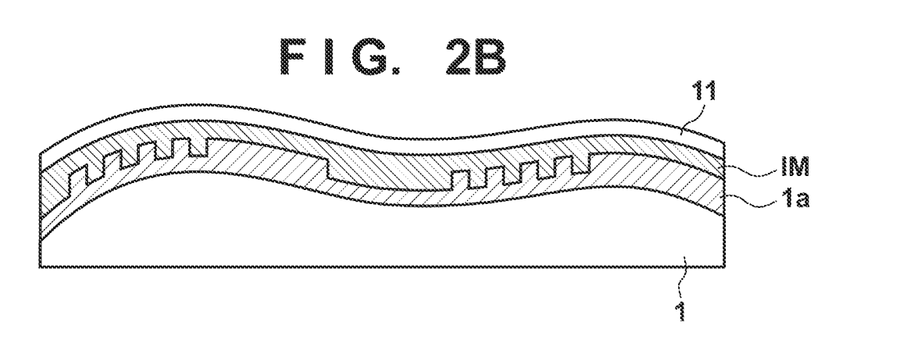
Figure 2C:
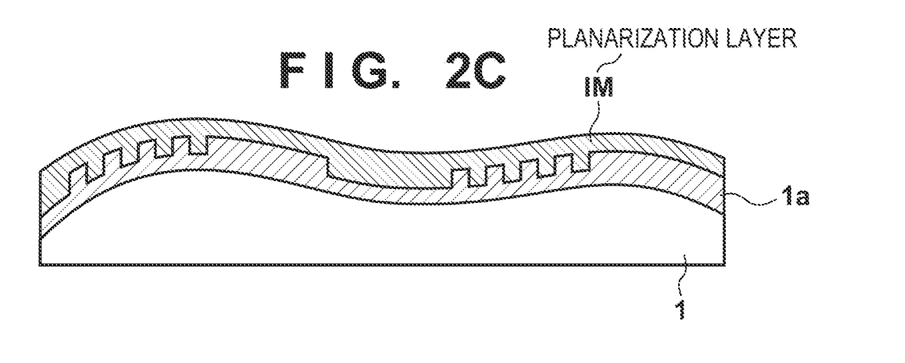

With reference to FIGS. 2A to 2C, an overview of planarization processing will be described. Firstly, as shown in FIG. 2A, the imprint material IM is supplied from the supply unit 20 to the substrate 1 on which an underlayer pattern 1a is formed. FIG. 2A shows a state in which the imprint material IM is supplied on the substrate prior to bringing the mold 11 into contact therewith. Next, as shown in FIG. 2B, the imprint material IM on the substrate and the planar portion 11a of the mold 11 are brought into contact. FIG. 2B shows a state in which the planar portion 11a of the mold 11 fully contacts the imprint material IM on the substrate, and the planar portion 11a of the mold 11 conforms to the surface shape of the substrate 1. Next, in the state shown in FIG. 2B, light is irradiated on the imprint material IM on the substrate from the light source 24 via the mold 11, and the imprint material IM is thereby cured. Next, as shown in FIG. 2C, the mold 11 is separated from the cured imprint material IM on the substrate. By this, it is possible to form a layer (a planarization layer) of the imprint material IM of a uniform thickness over the entire surface of the substrate 1. FIG. 2C shows a state in which the planarization layer of the imprint material IM on the substrate is formed.

Even when such planarization processing is performed normally, the imprint material on the substrate may adhere to the planar portion 11a of the mold 11, that is a defect may be generated when the mold 11 is separated from the cured imprint material on the substrate. This is because there are locations on the mold 11 (the planar portion 11a) are potentially prone to defects due to non-uniformity and distortion of the underlayer pattern formed on the substrate 1, the distribution of the imprint material supplied on the substrate, or the like.

Figure 3A:
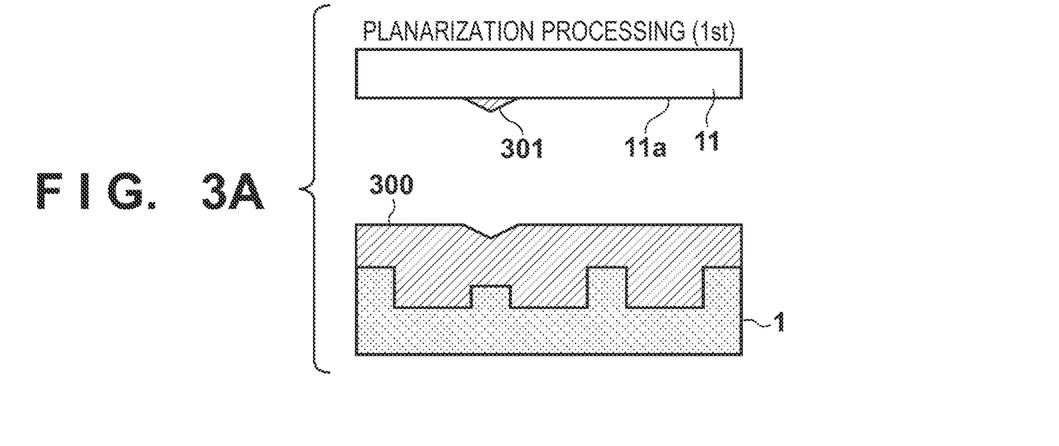
FIGS. 3A to 3C are views for explaining a defect generated in a mold by the planarization processing.

For example, as shown in FIG. 3A, even if planarization processing is performed normally with respect to the substrate 1, a defect 301 is generated on the planar portion 11a of the mold 11 due to a distortion 300 in the underlayer pattern formed on the substrate 1. FIG. 3A shows a state in which planarization processing is performed in relation to a first substrate 1 of a lot, that is a state in which planarization processing is performed once. The defect 301 generated by the first planarization process is, as shown in FIG. 3A, at a level that does not affect the next planarization process.

Figure 3B:
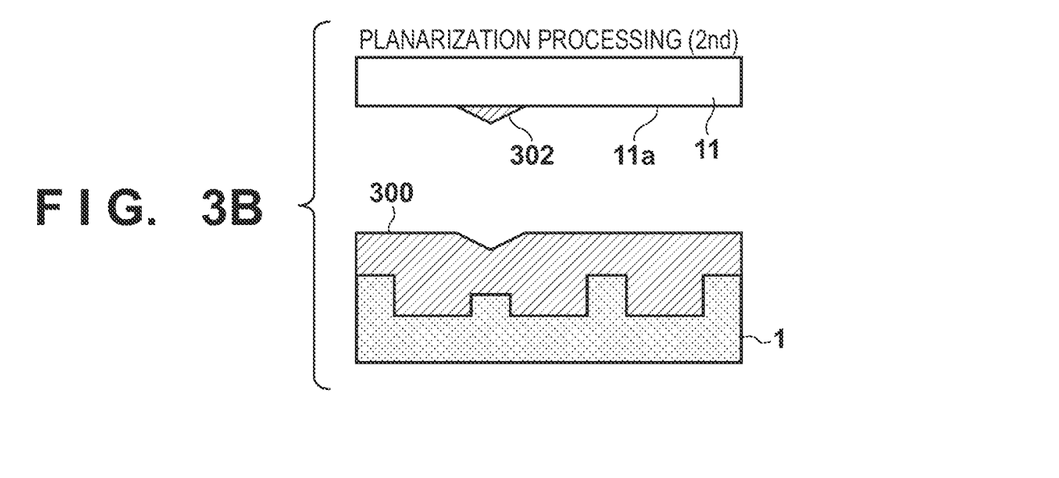

FIG. 3B shows a state in which planarization processing is performed in relation to a second substrate 1 of the lot, that is a state in which planarization processing is performed twice. Similarly to planarization processing on the first substrate 1, a defect 302 is generated in the planar portion 11a of the mold 11 due to the distortion 300 in the underlayer pattern formed on the second substrate 1. Note that because each of the plurality of substrates included in the same lot have similar characteristics (tendencies), the locations that are potentially prone to defects are the same. Accordingly, the defect 302 generated by the second planarization process ends up including the defect 301 generated by the first planarization process, and is therefore larger than the defect 301. The defect 302 may start to have an effect on subsequent planarization processes, and become an obstacle to planarization.

Figure 3C:
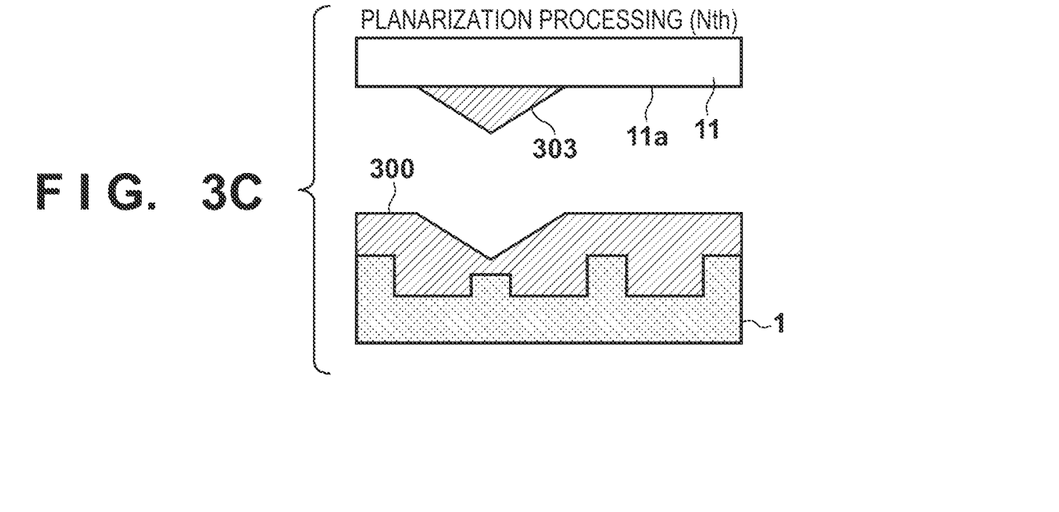

FIG. 3C shows a state in which planarization processing is performed in relation to an N-th substrate 1 of the lot, that is a state in which planarization processing was performed N times. Similarly to planarization processing thus far, a defect 303 is generated in the planar portion 11a of the mold 11 due to the distortion 300 in the underlayer pattern formed on the N-th substrate 1. Since the defect 303 generated by the N-th planarization process includes the defects generated from the first planarization process to the (N−1)-th planarization process, it is very large. The defect 303 affects subsequent planarization processing, and is an obstacle to planarization.

Accordingly, in the present embodiment, configuration is such that planarization processing is not performed multiple times with the relative positional relationship of the planar portion 11a of the mold 11 in relation to (the locations that are potentially prone to defects that are present on) the substrate 1 in the same state. In the present embodiment, the control unit 200 relatively drives the mold 11 and the processing target substrate 1 so that every time planarization processing is performed a predetermined number of times, the relative positional relationship between the processing target substrate 1 in the plurality of substrates included in the same lot and the planar portion 11a of the mold 11 is changed.

Figure 4:
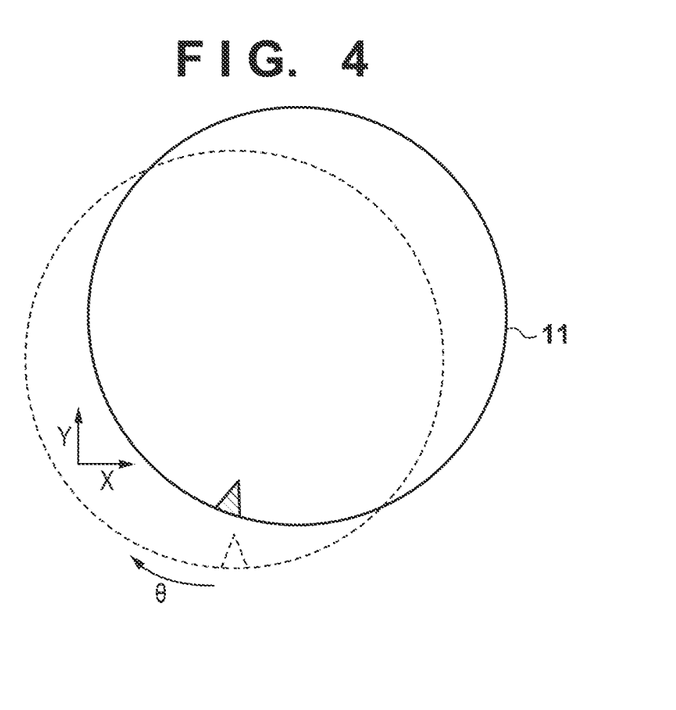
FIG. 4 is a view for explaining a relative driving of a mold in relation to a processing target substrate.

For example, as shown in FIG. 4, the mold driving unit 9, under the control of the control unit 200, drives (shifts) the mold 11 in relation to the processing target substrate 1. In FIG. 4, the mold 11 prior to driving is indicated by dashed lines, and the mold 11 after driving is indicated by solid lines. However, by the stage driving unit 31, the processing target substrate 1 may be driven in relation to the mold 11. Specifically, the mold driving unit 9 and the stage driving unit 31 drives (shift-drives) one of the mold chuck 12 holding the mold 11 and the chuck 2 holding the substrate 1 in relation to the other of the mold chuck 12 and the chuck 2 in a horizontal direction (the X-axis direction and the Y-axis direction). Also, the mold driving unit 9 and the stage driving unit 31 may rotationally drive one of the mold chuck 12 and the chuck 2 in relation to the other of the mold chuck 12 and the chuck 2 about an axis parallel to the vertical direction (the Z-axis direction) whenever planarization processing has been performed a predetermined number of times. Driving the mold 11 and the processing target substrate 1 relatively in the horizontal direction and rotationally driving the mold 11 and the processing target substrate 1 about an axis parallel to the vertical direction may also be combined. In this way, the directions of driving of the mold 11 and the processing target substrate 1 relatively are the X-axis direction, the Y-axis direction, the rotation direction, and a compositive direction thereof.

Also, configuration may be taken so as to hold the mold 11 being held by the mold chuck 12 by the mold conveyance unit 32, and to change the position of the mold 11 relative to the mold chuck 12 when the mold conveyance unit 32 transfers the mold 11 to the mold chuck 12 whenever planarization processing is performed a predetermined number of times. In this way, by changing the position of the mold 11 in relation to the mold chuck 12, it is possible to change the relative positional relationship between the processing target substrate 1 and the planar portion 11a of the mold 11.

The amount (driving amount) that the mold 11 and the processing target substrate 1 are driven relatively is set to a particular amount such that planarization processing can be performed stably for each of the plurality of substrates 1. For example, the amount that the mold 11 and the processing target substrate 1 are driven relatively in the horizontal direction is 100 nm, and the amount (amount of rotation) that the mold 11 and the processing target substrate 1 are rotationally driven about an axis parallel to the vertical direction is one degree. Also, the amount in which the mold 11 and the processing target substrate 1 are relatively driven need not be fixed, and the amount that the mold 11 and the processing target substrate 1 are relatively driven may change whenever planarization processing is performed a predetermined number of times.

Note that it is advantageous that the mold 11 and the processing target substrate 1 be driven relatively whenever the planarization processing is performed once, specifically that the aforementioned predetermined number of times be one. However, considering the throughput (productivity) of the planarization apparatus 100, it is not realistic to drive the mold 11 and the processing target substrate 1 relatively whenever the planarization processing is performed once. Accordingly, the predetermined number of times may be determined while predicting adherence of the imprint material to the planar portion 11a of the mold 11 based on the underlayer pattern formed on the surfaces of the plurality of substrates 1 and the distribution of imprint material supplied to each of the plurality of substrates 1. Processing for determining the predetermined number of times may be performed by the control unit 200 (determination unit), and may be performed by an external information processing apparatus. Also, the planarization apparatus 100 further includes the input unit 34 for the user to input the predetermined number of times, as shown in FIG. 1. The input unit 34 includes a keyboard, a mouse, a touch panel, or the like for inputting the predetermined number of times via a screen displayed on the display.

Figure 5:
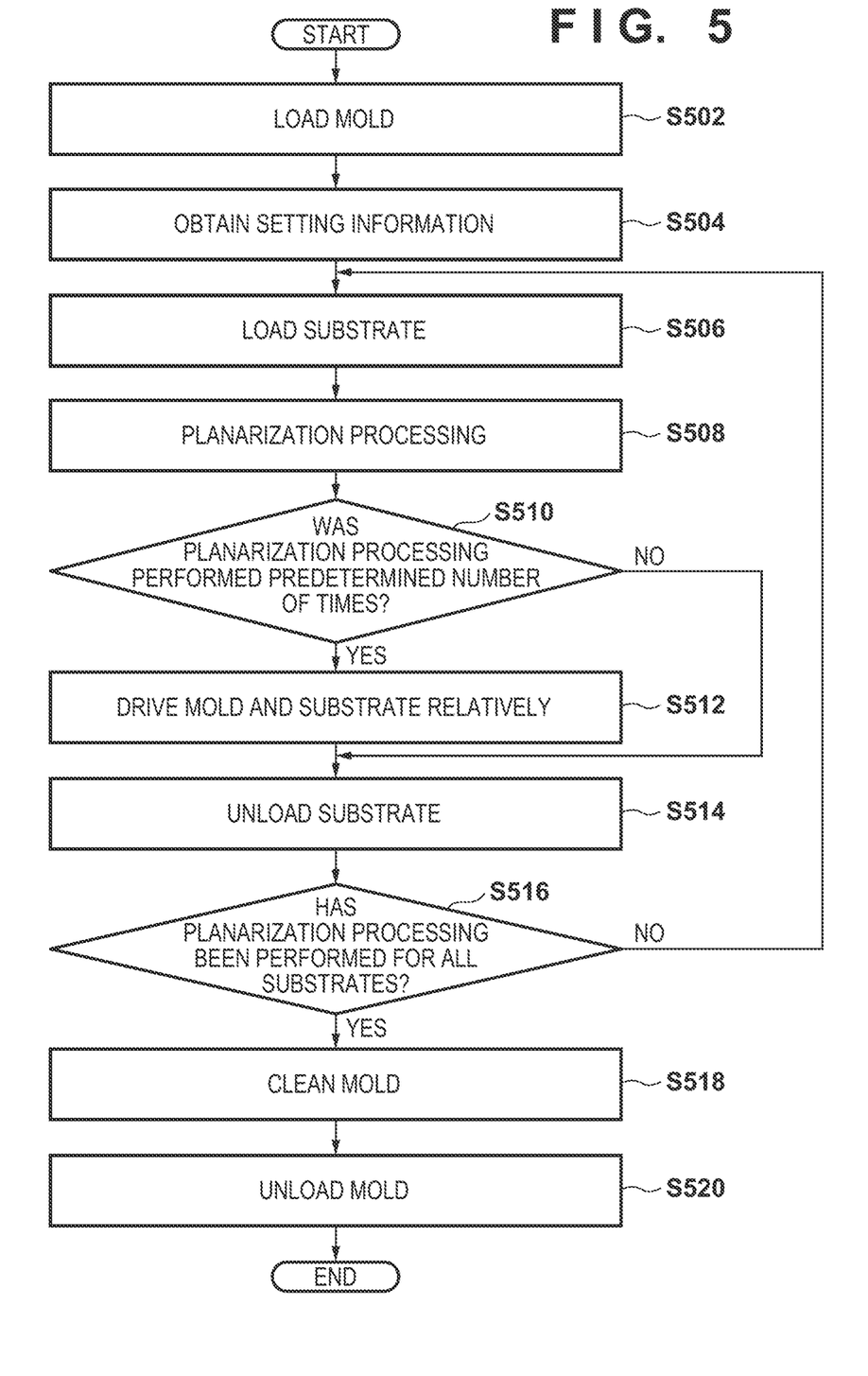
FIG. 5 is a flowchart for explaining the planarization processing according to the planarization apparatus shown in FIG. 1.

With reference to FIG. 5, planarization processing in the planarization apparatus 100 will be described. The planarization processing, as described above, is performed by the control unit 200 controlling each unit of the planarization apparatus 100 comprehensively.

In step S502, the mold 11 is loaded by the mold conveyance unit 32 to the planarization apparatus 100, and this mold 11 is held by the mold chuck 12. In step S504, setting information regarding the planarization processing is obtained. The setting information regarding the planarization processing includes information indicating how many times the planarization processing is performed before the mold 11 and the processing target substrate 1 are relatively driven, that is, the foregoing predetermined number of times and the amount (driving amount and amount of rotation) that the mold 11 and the processing target substrate 1 are relatively driven.

In step S506, a processing target substrate 1 out of the plurality of substrates included in the same lot is loaded to the planarization apparatus 100 by the substrate conveyance unit 22, and that substrate 1 is held by the chuck 2. In step S508, the planarization processing described with reference to FIGS. 2A to 2C is performed on the substrate 1 loaded in step S506.

In step S510, it is determined whether or not planarization processing was performed the predetermined number of times. In the case where planarization processing has been performed the predetermined number of times, the processing transitions to step S512. Meanwhile, in the case where planarization processing has not been performed the predetermined number of times, the processing transitions to step S514.

In step S512, so that the relative positional relationship between the processing target substrate 1 and the planar portion 11a of the mold 11 changes, the mold 11 and the processing target substrate 1 are driven relatively. The relative driving of the mold 11 and the processing target substrate 1 is as described above. The relative positional relationship between the processing target substrate 1 and the planar portion 11a of the mold 11 is changed so as to achieve a positional relationship that is different to the relative position between the substrate 1 and the mold 11 when the planarization processing was performed prior to the processing target substrate 1. In step S514, by the substrate conveyance unit 22, the substrate 1 for which the planarization processing was performed is unloaded from the planarization apparatus 100.

In step S516, it is determined whether or not planarization processing was performed on all of the substrates included in the same lot. In the case where the planarization processing has not been performed on all of the substrates included in the same lot, the processing transition to step S506 in order to load the next processing target substrate 1 to the planarization apparatus 100. Meanwhile, in the case where planarization processing has been performed on all of the substrates included in the same lot, the processing transitions to step S518.

In step S518, the mold 11 being held in the mold chuck 12 is cleaned (that is, the imprint material adhered to the planar portion 11a of the mold 11 is removed) by the cleaning unit 33. In step S520, by the mold conveyance unit 32, the cleaned mold 11 is unloaded from the planarization apparatus 100.

In this way, in the present embodiment, it is possible to suppress imprint material adhering to the same location of the planar portion 11a since the relative positional relationship between the processing target substrate 1 and the planar portion 11a of the mold 11 is changed whenever planarization processing is performed a predetermined number of times. Accordingly, even when the planarization apparatus 100 continues planarization processing on substrates 1, it is possible to maintain accuracy in planarization of the substrates 1 by suppressing the generation of defects that affect the next planarization processing in the mold 11 (the planar portion 11a).

Note that in the present embodiment, planarization processing with respect to all substrates 1 included in the same lot ends, and the mold 11 is cleaned prior to unloading the mold 11 from the planarization apparatus 100, but limitation is not made to this. For example, configuration may be taken such that, even if the planarization processing has not ended for all substrates 1 included in the same lot, the mold 11 is cleaned if the number of times that the mold 11 and the processing target substrate 1 are driven relatively reaches a predetermined number of times. Also, in a case where the planarization apparatus 100 is provided with a detection unit, configuration may be taken such that the mold 11 is cleaned in accordance with the result of detection by the detection unit which detects a state in which imprint material is adhered in the planar portion 11a of the mold 11.

Also, in the present embodiment, a case in which planarization processing is performed collectively on the entire surface of the processing target substrate 1 was described, but the planarization processing may be performed for each of shot regions of a substrate 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-027252 filed on Feb. 19, 2018, which is hereby incorporated by reference herein in its entirety.

What is claimed is:

1. A planarization apparatus which planarizes a composition on a substrate by using a mold, the apparatus comprising:
   a processing unit configured to, for each of a plurality of substrates, perform planarization processing, by bringing a planar portion of the mold into contact with the composition on the substrate and making the planar portion conform to a surface shape of the substrate, for planarizing the composition; and
   a driving unit configured to, in a case where the planarization processing is performed a predetermined number of times for a predetermined number of substrates, respectively, relatively drive the mold and the plurality of substrates such that:
   (i) a first relative positional relationship between the planar portion and a first group of the predetermined number of substrates is the same for the planarization processing of the first group of the predetermined number of substrates,
   (ii) a second relative positional relationship between the planar portion and a second group of the predetermined number of substrates different from the first group of the predetermined number of substrates is the same for the planarization processing of the second group of the predetermined number of substrates, and
   (iii) the first relative positional relationship between the planar portion and the first group of the predetermined number of substrates for the planarization processing of the first group of the predetermined number of substrates is different from the second relative positional relationship between the planar portion and the second group of the predetermined number of substrates for the planarization processing of the second group of the predetermined number of substrates.

2. The planarization apparatus according to claim 1, further comprising a mold holder configured to hold the mold; and
   a substrate holder configured to hold each of the plurality of substrates, wherein the driving unit, whenever the planarization processing is performed the predetermined number of times, drives one of the mold holder and the substrate holder in relation to the other of the mold holder and the substrate holder in a horizontal direction.

3. The planarization apparatus according to claim 2, wherein the driving unit, whenever the planarization processing is performed the predetermined number of times, rotationally drives one of the mold holder and the substrate holder in relation to the other of the mold holder and the substrate holder about an axis parallel to a vertical direction.

4. The planarization apparatus according to claim 1, further comprising:
 a mold holder configured to hold the mold; and
 a substrate holder configured to hold each of the plurality of substrates,
 wherein the driving unit, whenever the planarization processing is performed the predetermined number of times, rotationally drives one of the mold holder and the substrate holder in relation to the other of the mold holder and the substrate holder about an axis parallel to a vertical direction.

5. The planarization apparatus according to claim 1, further comprising a mold holder configured to hold the mold,
 wherein the driving unit includes a mold conveyance unit configured to hold the mold and transfer the mold to the mold holder, and whenever the planarization processing is performed the predetermined number of times, the driving unit causes the mold being held by the mold holder to be held by the mold conveyance unit, and changes a position of the mold in relation to the mold holder when the mold conveyance unit transfers the mold to the mold holder.

6. The planarization apparatus according to claim 1, further comprising a cleaning unit for performing cleaning of the mold in order to remove a portion of composition that has adhered to the planar portion.

7. The planarization apparatus according to claim 1, wherein the processing unit performs the planarization processing collectively on an entire surface of each of the plurality of substrates.

8. The planarization apparatus according to claim 1, further comprising a determination unit configured to determine the predetermined number of times based on an underlayer pattern formed on a surface of each of the plurality of substrates and a distribution of the composition supplied to each of the plurality of substrates.

9. The planarization apparatus according to claim 1, further comprising an input unit for a user to input the predetermined number of times.

10. The planarization apparatus according to claim 1, further comprising a supply unit configured to supply the composition to each of the plurality of substrates.

11. The planarization apparatus according to claim 1, wherein the plurality of substrates are included in the same lot of substrates.

12. A planarization apparatus which planarizes a composition on a substrate by using a mold, the apparatus comprising:
 a processing unit configured to, for each of a plurality of substrates, perform planarization processing, by bringing a planar portion of the mold into contact with the composition on the substrate and making the planar portion conform to a surface shape of the substrate, for planarizing the composition; and
 a driving unit configured to relatively drive the mold and a processing target substrate among the plurality of substrates so that (a) a first relative positional relationship between (i) the processing target substrate and (ii) the planar portion when a first composition on the processing target substrate and the planar portion are brought into contact with each other differs from (b) a second relative positional relationship between (iii) another substrate among the plurality of substrates on which the planarization processing was performed prior to the processing target substrate and (iv) the planar portion when a second composition on the another substrate and the planar portion were brought into contact with each other.

13. The planarization apparatus according to claim 12, further comprising a supply unit configured to supply the composition to each of the plurality of substrates.

14. The planarization apparatus according to claim 12, wherein the plurality of substrates are included in the same lot of substrates.

* * * * *